(12) United States Patent
Chang et al.

(10) Patent No.: US 6,806,104 B1
(45) Date of Patent: Oct. 19, 2004

(54) METHOD FOR DETECTING DEFECT OF SEMICONDUCTOR DEVICE

(75) Inventors: Houng-Jie Chang, Taichung County (TW); Sheng-Ju Chang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/605,357

(22) Filed: Sep. 25, 2003

(51) Int. Cl.[7] .............................. H01L 21/66
(52) U.S. Cl. ..................... 438/16; 438/14; 438/17; 438/597
(58) Field of Search ............ 438/16, 14, 17, 438/597

(56) References Cited

U.S. PATENT DOCUMENTS

| | | | |
|---|---|---|---|
| 6,107,201 A | * | 8/2000 | Lee .................. 438/688 |
| 6,168,960 B1 | * | 1/2001 | Li ..................... 438/14 |
| 6,258,437 B1 | * | 7/2001 | Jarvis ................ 428/137 |
| 6,593,152 B2 | * | 7/2003 | Nakasuji et al. ...... 438/14 |
| 6,709,879 B2 | * | 3/2004 | Yeh ................... 438/16 |
| 2003/0124791 A1 | * | 7/2003 | Summerfelt et al. ... 438/238 |

* cited by examiner

*Primary Examiner*—Maria F. Guerrero
*Assistant Examiner*—Christy Novacek
(74) *Attorney, Agent, or Firm*—Jiang Chyun IP Office

(57) ABSTRACT

A method for detecting defects of a semiconductor device is provided. The semiconductor device comprises at least a substrate, a gate, a source region, a drain region, a plug, an insulating layer, and a conducting line. The plug electrically connects the source region or the drain region and is above a portion of the gate. At least a defect exists between the plug and the gate. The method comprises: polishing the semiconductor device until the plug above the gate is removed; cleaning the semiconductor device; removing the insulating layer between the gate and the plug; and detecting the defect between the plug and the gate.

14 Claims, 6 Drawing Sheets

METHOD FOR DETECTING DEFECT OF SEMICONDUCTOR DEVICE

BACKGROUND OF INVENTION

1. Field of the Invention

This invention generally relates to a method of detecting semiconductor device, and more particularly to a method of detecting defect of a semiconductor device.

2. Description of the Related Art

An integrated circuit integrates devices and circuit into a 2 cm×2 cm or smaller area. Because it generally includes more than ten thousand solid-state devices, an integrated circuit is so called a microelectronic device. If a microelectronic device has a defect, the microelectronic device may not operate properly. Further, when the size of the device becomes smaller, it is very difficult to improve the yield rate. One of the key issues regarding the yield rate is the defect in the microelectronic device. Therefore, how to detect and reduce the defects is a very important issue in improving the yield rate.

The conventional method of detecting defects is to decap each layer of the device by etching and to analyze the defects in each layer. That is, the conventional method removes each layer from top to bottom and finds out the defects in each layer until the bottom layer of the device.

However, as the integration level of the device increases, the conventional method may not be applicable, especially for detecting the defects generated during the front-end process, because it takes a long time to decap each layer to find out if there is any defect in a particular layer. Further, the defect may be removed during the etching process so that the defect cannot be detected any more.

SUMMARY OF INVENTION

An object of the present invention is to provide a method of detecting defect of semiconductor device in order to precisely and quickly detect the defects in the device.

The present invention provides a method of detecting defect of semiconductor device. The semiconductor device at least includes a substrate, a gate, a source region, a drain region, a plug, an insulating layer and a conducting line. The plug electrically connects the source region or the drain region and is located above a portion of the gate. At least a defect exists between the plug and the gate. The method comprises: polishing the semiconductor device until the plug is not above the portion of the gate; cleaning the semiconductor device; removing the insulating layer between the gate and the plug; and detecting the defect between the plug and the gate.

In a preferred embodiment of the present invention, the polishing step further comprises polishing the semiconductor device to partially expose the gate. The cleaning step comprises using deionized water to clean the semiconductor device and drying the semiconductor device. The removing step comprises performing a wet etching process and performing a dry etching process.

The present invention polishes the semiconductor device until the plug above the gate is substantially removed and then the insulating layer between the gate and the plug is removed. Hence, the method of the present is capable of eliminating the defects occurring from removal steps using the wet etching processes and therefore the defect can be precisely and effectively detected.

The present invention provides a method of detecting defect of semiconductor device. The semiconductor device at least includes two adjacent conducting layers and an insulating layer. The insulating layer is disposed between the two adjacent conducting layers, wherein a defect exists between the two adjacent conducting layers. The method comprises: polishing the semiconductor device to partially expose the two adjacent conducting layers; removing the insulating layer between the two adjacent conducting layers; and detecting the defect between the two adjacent conducting layers.

In a preferred embodiment of the present invention, after the polishing step and before the removing step, the method further comprises cleaning the semiconductor device. The cleaning step comprises using deionized water to clean the semiconductor device and drying the semiconductor device. The removing step comprises a wet etching process or a dry etching process.

In a preferred embodiment of the present invention, the semiconductor device is polished until the two adjacent conducting layers are partially exposed and then the insulating layer between the two adjacent conducting layers is removed. Hence, the method of the present invention is capable of preventing the defect occurring due to removal steps using wet etching process, and therefore the defect can be precisely and effectively detected.

The above is a brief description of some deficiencies in the prior art and advantages of the present invention. Other features, advantages and embodiments of the invention will be apparent to those skilled in the art from the following description, accompanying drawings and appended claims.

DETAILED DESCRIPTION

Figure 1A:
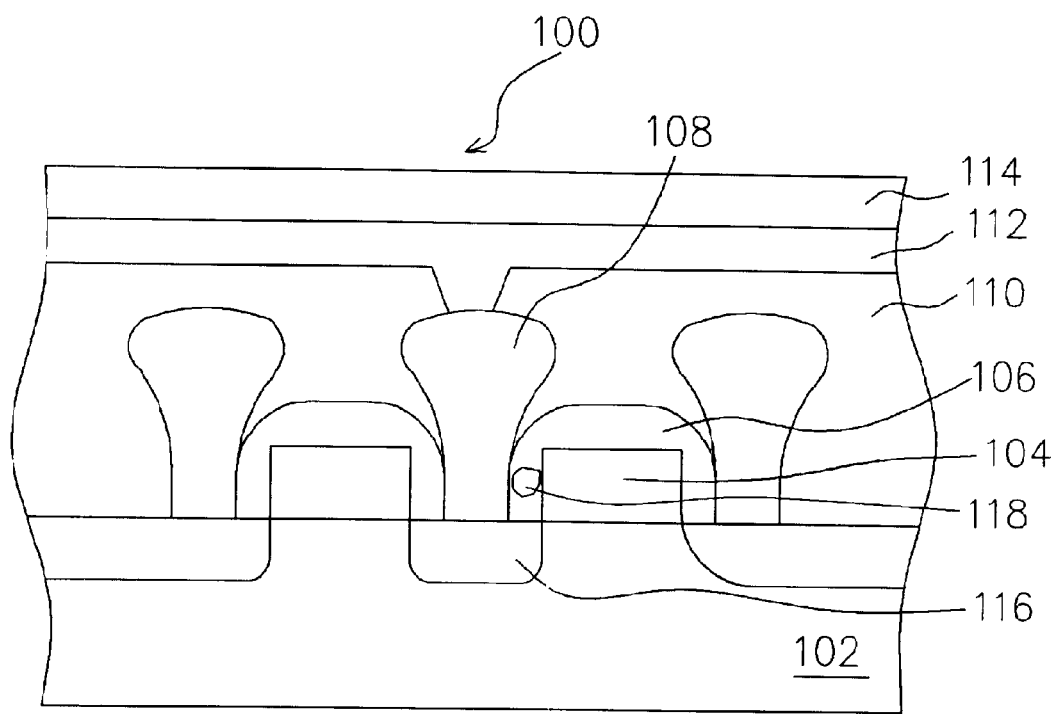
FIGS. 1A–1C are cross-sectional views illustrating the process for detecting the defects in a semiconductor device in accordance with a preferred embodiment of the present invention.
Figure 1B:
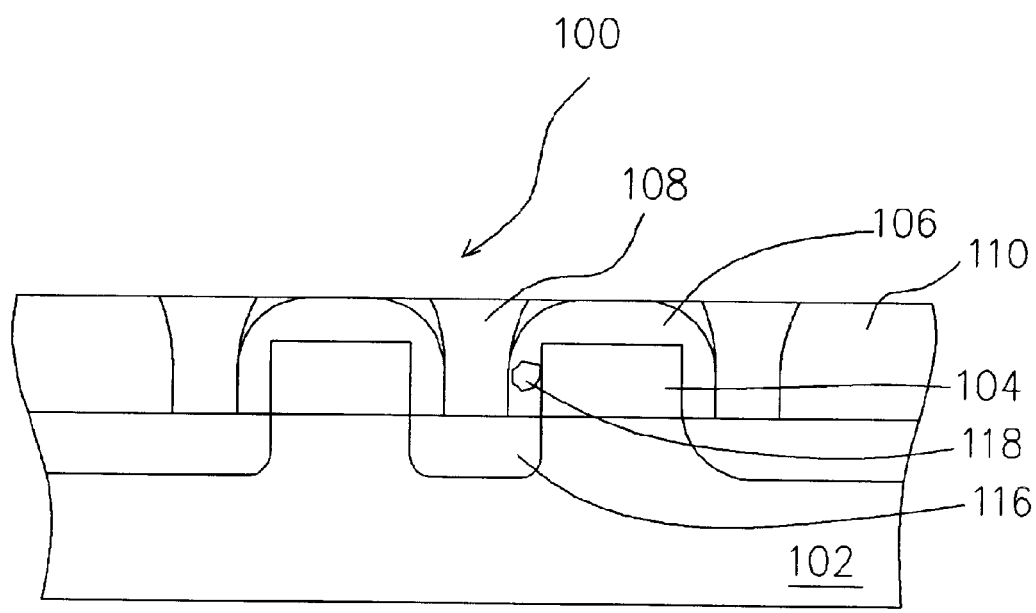
Figure 1C:
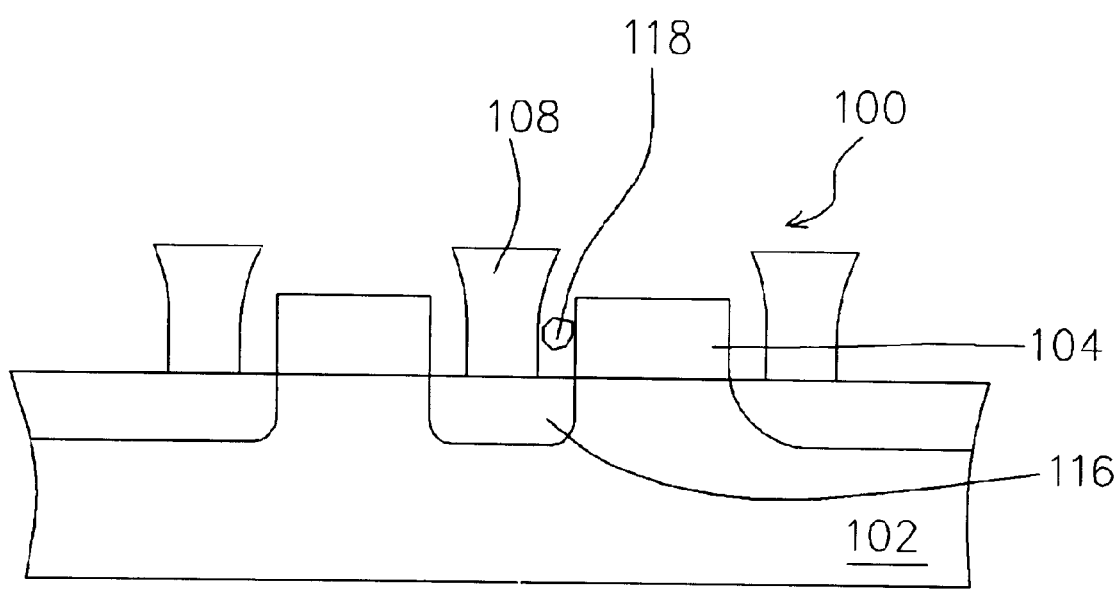

FIGS. 1A–1C are cross-sectional views illustrating the process for detecting the defects in a semiconductor device in accordance with a preferred embodiment of the present invention.

Referring to FIG. 1A, a semiconductor device 100 includes a substrate 102, a gate 104, a passivation layer 106, a plug 108, an insulating layer 110, a bit line 112, and a stack layer 114.

The plug 108 electrically connects with the source region or the drain region 116 and is located above a portion of the gate 104. A defect 118 exists between the plug 108 and the gate 104. The defect 118 is, for example, a conductive particle which may cause a short between the plug 108 and the gate 104, such as, for example, a nanomemter scale defect. The passivation layer 106 is comprised of, for example, a TEOS silicon oxide layer and a silicon nitride layer. The insulating layer 110 is comprised of, for example, a TEOS silicon oxide layer. The stack layer 114 includes a capacitor, the insulating layer, the plug, and the conducting line layer above the bit line 112. For simplicity, in this embodiment, the stack layer 114 is used to represent the subsequent layers formed above the bit line.

Referring to FIG. 1B, a polishing step is performed to polish the semiconductor device 100 until the plug 106 above the gate 104 is substantially removed. In this polishing step, the polishing machine is, for example, a dimple grinder, Model 656N, JOEL Ltd. Alternatively, the polishing step is performed until the gate 104 is partially exposed. Then a cleaning step is performed to clean the semiconductor device 100. During the cleaning step, deionized water is used to clean the semiconductor device 100 and then the semiconductor device 100 is dried. The cleaning step usually takes about 5–10 seconds.

Referring to FIG. 1C, a removing step is performed to remove the insulating layer 110 and the passivation layer 106 between the gate 104 and the plug 108. Preferably, the removing step includes a wet etching process which is performed by using HF as an etchant to remove the TEOS silicon oxide. Then a dry etching process such as reactive ion etching process is performed to remove the silicon nitride layer and the TEOS silicon oxide. In this step, because the defect 118 usually is a conductive particle, it will not be removed. Further, after removing the passivation layer 106 and the insulating layer 110 located between the gate 104 and the plug 108, a cleaning step is performed. Thereafter, the defect 118 between the plug 108 and the gate 104 can be detected. To detect the defect, a scanning electron microscope could be used.

In the above embodiment, a defect between the plug and the gate is used as an example to illustrate the method of the present invention. However, the method of the present invention also can be applied to detect the defect between the conducting layers (conducting lines). For example, to detect the defect between the conducting layers, a polishing step is performed to polish the semiconductor until two adjacent conducting layers are exposed. Then the insulating layer between two adjacent conducting layers is removed by using a wet or a dry etching process. A scanning electron microscope then is used to detect the defect between two adjacent conducting layers.

To illustrate the advantages of the present invention, Experiment 1, Experiment 2, and Comparison 1 are used to further describe the method of the present invention. A DRAM is used in Experiment 1, Experiment 2, and Comparison 1.

Figure 2A:
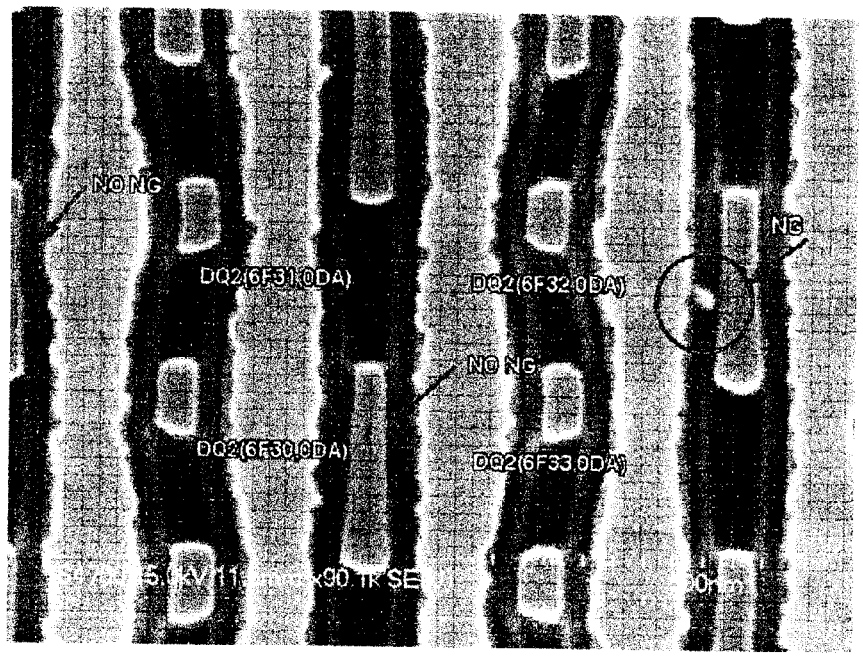
FIGS. 2A–2B are scanning electron microscope photographs of a semiconductor device in accordance with Experiment 1 of the present invention.
Figure 2B:
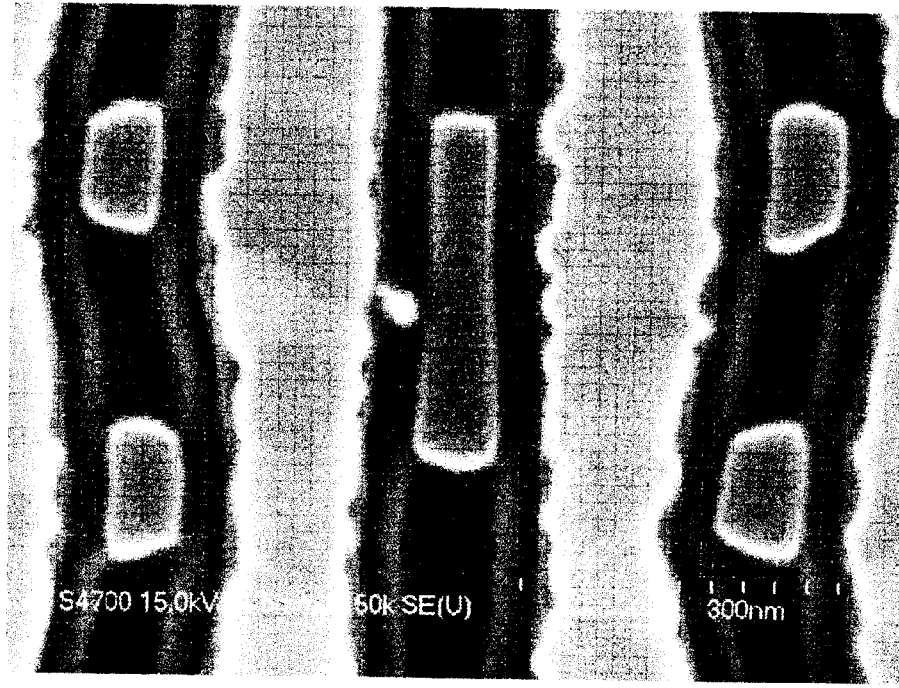

<Experiment 1>A semiconductor chip (a DRAM chip) having a critical dimension of 0.15 μm is provided. The chip is polished until the plug above the gate is substantially removed. In this polishing step, the polishing time is about 12 minutes. After the chip is cleaned, the insulating layer between the plug and the gate is removed. In this step, a wet etching step is performed for 1 minute by using HF as an etchant. After the insulating layer is removed, the chip is cleaned again. Then a scanning electron microscope is used to detect the defect between the plug and the gate. The results are shown in FIGS. 2A–2B, which show the cell area of the DRAM.

Figure 3A:
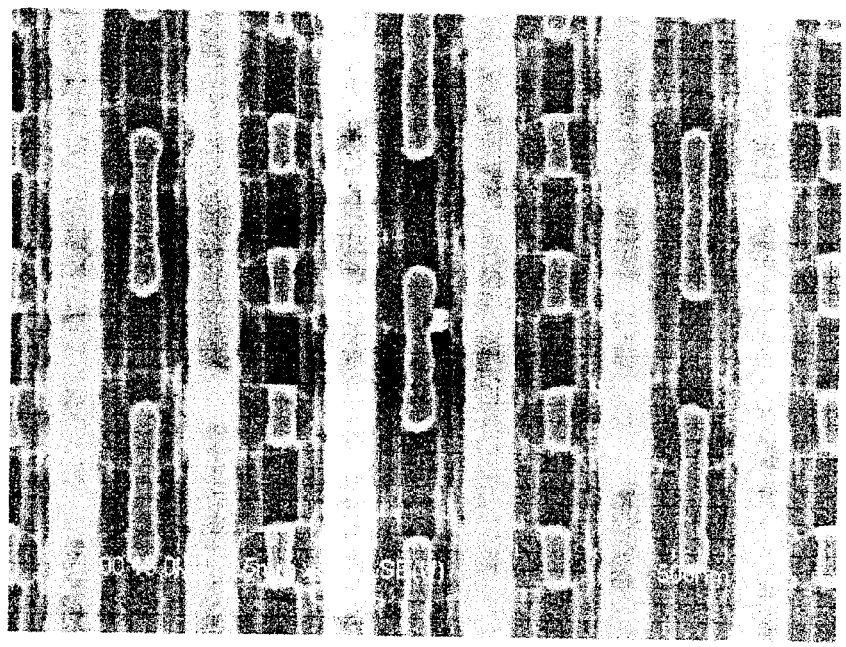
FIGS. 3A–3B are scanning electron microscope photographs of a semiconductor device in accordance with Experiment 2 of the present invention.
Figure 3B:
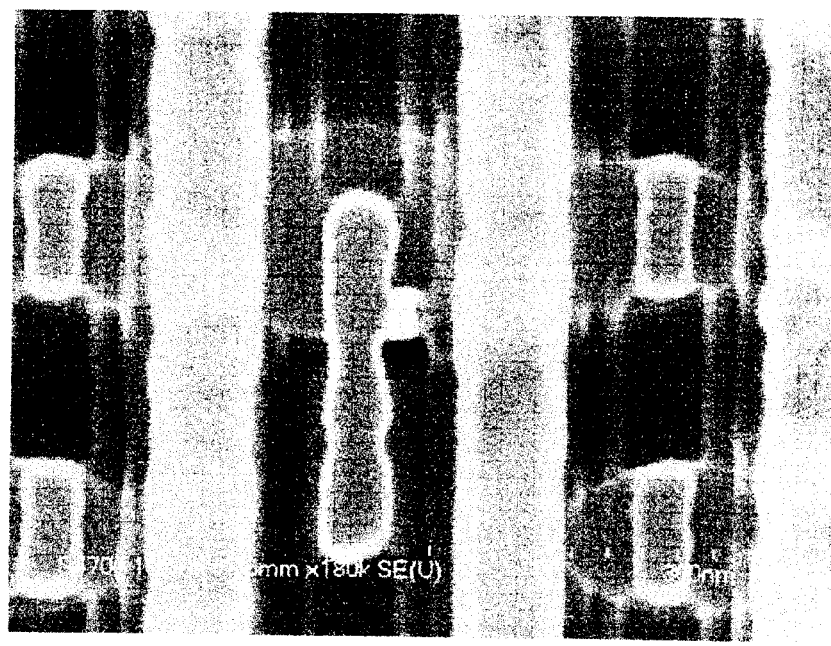

<Experiment 2>A semiconductor chip (a DRAM chip) having a critical dimension of 0.13 μm is provided. The same steps are performed in this experiment on the chip as in Experiment 1. Then a scanning electron microscope is used to detect the defect between the plug and the gate. The results are shown in FIGS. 3A–3B, which show the cell area of the DRAM.

<Comparison 1>A semiconductor chip (a DRAM chip) having a critical dimension of 0.15 μm is provided. First, a wet etching process using HF as an etchant is performed for 3 minutes to remove the conducting layer. Then a cleaning step is performed. Next, a wet etching process using $H_2SO_4$ as an etchant is performed for 10 minutes to remove the top cell plate layer.

To remove the storage node layer, a reactive ion etching process is performed for 2 minutes to remove the silicon nitride/silicon oxide/silicon nitride dielectric layer. A wet etching process using HF as an etchant is performed for 5 mins to further remove the silicon nitride/silicon oxide/silicon nitride dielectric layer and to remove the insulating layer. The bottom cell plate layer is removed by using KOH as an etchant for 15 seconds. A wet etching process using HF as an etchant is performed for 5 minutes to further remove the bottom cell plate layer.

Figure 4A:
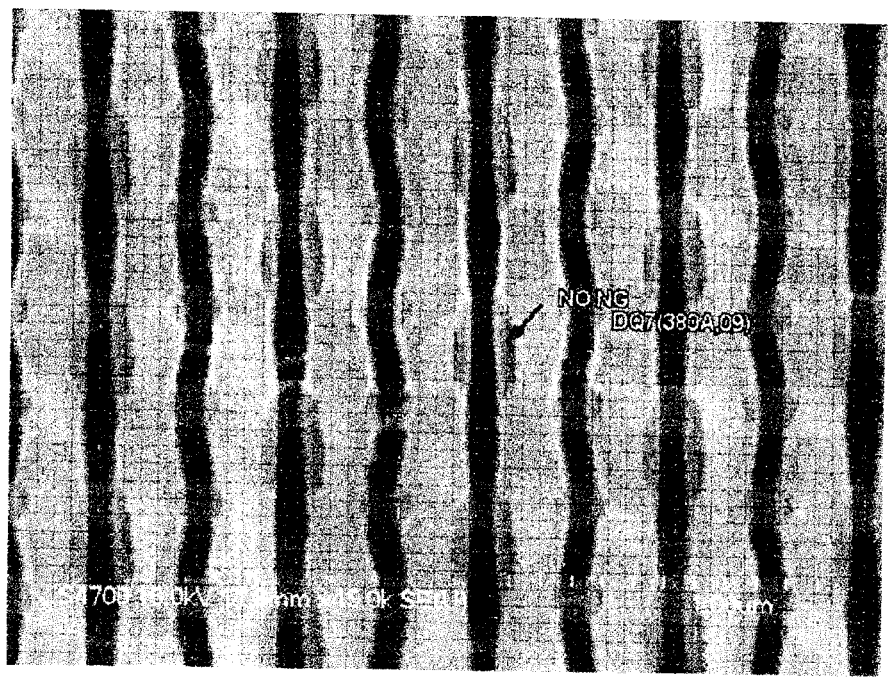
FIGS. 4A–4B are scanning electron microscope photographs of a semiconductor device in accordance with Comparison 1 of the present invention.
Figure 4B:
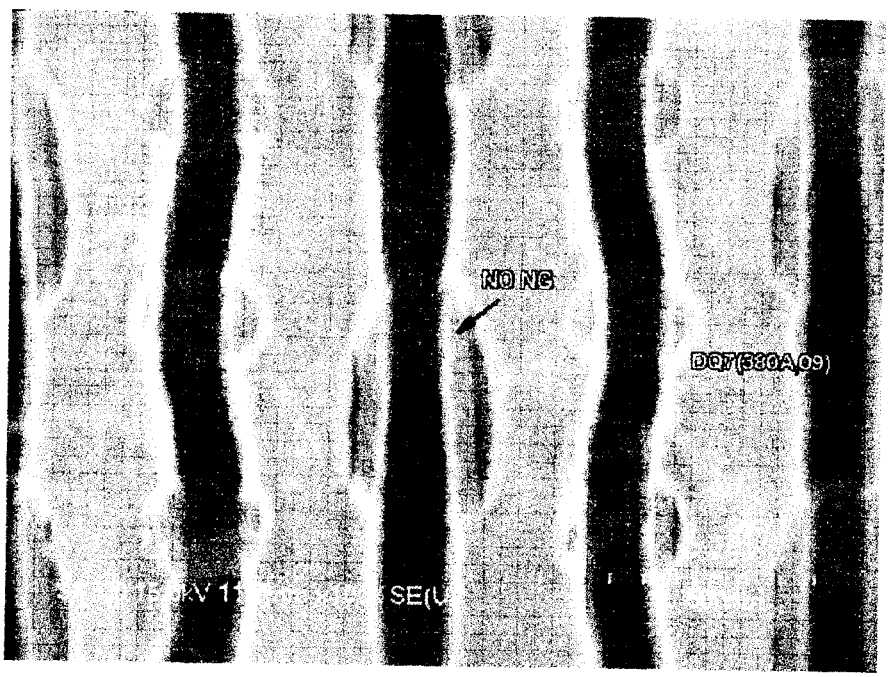

To remove the bit line and the plug, a wet etching process using $H_2so_4$ as an etchant is performed for 10 minutes to remove the metal layer. The polysilicon layer is removed by using KOH as an etchant for 20 seconds. A wet etching process using HF as an etchant is performed for 5 minutes to further remove the remaining bit line and the plug. After removing the bit line and the plug, a scanning electron microscope is used to detect the defect between the plug and the gate. The results are shown in FIGS. 4A–4B, which show the cell area of the DRAM. It should be noted that after each removing step, a cleaning step would be performed.

By analyzing the results in Experiments 1 and 2 shown in FIGS. 2B and 3B, the defects can be clearly observed between the gate and the plug. Further, the present invention also can be applied to the device having a smaller critical dimension. However, the result indicated in Comparison 1 (FIG. 4B) cannot show the defect between the plug and the gate. This is because the defect is usually a conductive particle. During the removal of the plug using wet etching process, the defect is also removed. Hence, the defect cannot be defected in FIG. 4B.

Further, Experiments 1 and 2 take about 15 minutes to detect the defect. However, Comparison 1 takes at least 30 minutes. Hence, the method of the present invention can save more time than the conventional method.

Figure 5A:
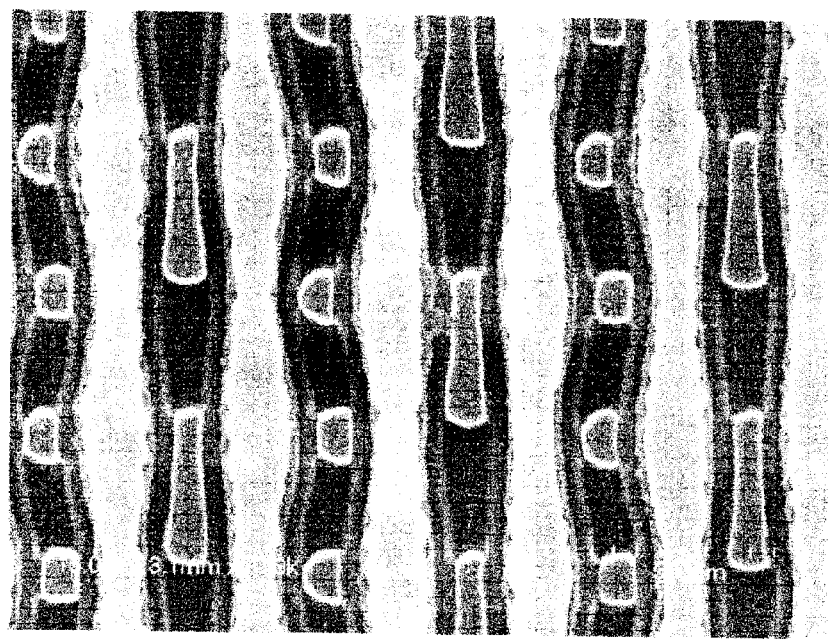
FIGS. 5A–5B are scanning electron microscope photographs of a semiconductor device in accordance with another experiment of the present invention.
Figure 5B:
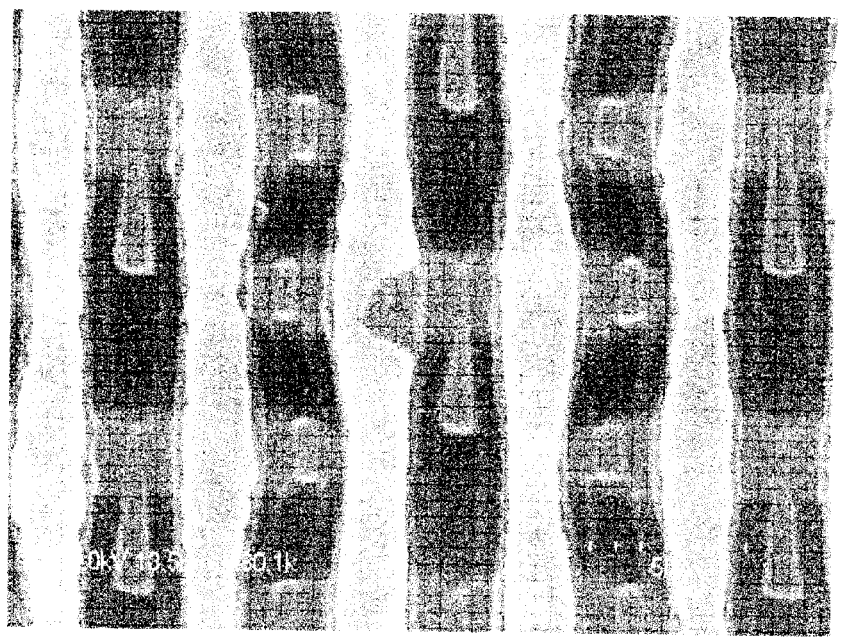

Further, FIGS. 5A–5B are the scanning electron microscope photographs of a semiconductor device in accordance with another experiment of the present invention. As shown in FIGS. 5A–5B, the defect between the plug and the gate is clearly shown.

In Experiment 1, Experiment 2, and Comparison 1, the DRAM is used as examples. However, the present invention can also be applied to detect the defects of the peripheral circuit of the DRAM or other semiconductor devices.

In the embodiment of the present invention, the semiconductor device subjected to a polishing step until the plug above the gate is substantially removed and then the insulating layer between the gate and the plug are removed. Hence, the method of the present invention is capable of preventing the defect occurring due to the wet etching process and therefore the defect can be precisely and effectively detected.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A method of detecting defects of a semiconductor device, said semiconductor device comprising a substrate, a gate, a source region, a drain region, a plug, an insulating layer, and a conducting line, said plug electrically connected with one of said source region and said drain region and located above a portion of said gate, at least a defect existing between said plug and said gate, said method comprising:

polishing said semiconductor device until said plug above said gate is substantially removed;

cleaning said semiconductor device;

removing said insulating layer between said gate and said plug; and detecting said defect between said plug and said gate.

2. The method of detecting defects of a semiconductor device of claim 1, wherein said polishing step further comprises polishing said semiconductor device to partially expose said gate.

3. The method of detecting defects of a semiconductor device of claim 1, wherein said cleaning step comprises:

using deionized water to clean said semiconductor device; and drying said semiconductor device.

4. The method of detecting defects of a semiconductor device of claim 1, wherein the step of removing said insulating layer comprises:

performing a wet etching process, or performing a dry etching process.

5. The method of detecting defects of a semiconductor device of claim 4, wherein a material of said insulating layer comprises silicon dioxide, and an etchant of said wet etching process comprises HF.

6. The method of detecting defects of a semiconductor device of claim 4, wherein said dry etching process comprises a reactive ion etching process.

7. The method of detecting defects of a semiconductor device of claim 4, wherein said detecting step comprises using a scanning electron microscope to detect said defect.

8. A method of detecting defects of a semiconductor device, said semiconductor device comprising a conductive line on a substrate, an insulating layer over said conductive line and said substrate, a plug formed in said insulating layer and connected to said substrate, and an interconnection layer over said insulating layer, wherein a portion of said plug is located over said conductive line and a defect exits between said plug and said conductive line said method comprising:

polishing said semiconductor device until said portion of said plug located over said conductive line is removed;

removing said insulting layer between said plug and said conductive line; and detecting said defect.

9. The method of detecting defects of a semiconductor device of claim 8, further comprising cleaning said semiconductor device after said polishing step and before said removing step.

10. The method of detecting defects of a semiconductor device of claim 9, wherein said cleaning step comprises:

using deionized water to clean said semiconductor device; and drying said semiconductor device.

11. The method of detecting defects of a semiconductor device of claim 8, wherein said step of removing said insulating layer comprises a wet etching process.

12. The method of detecting defects of a semiconductor device of claim 8, wherein said step of removing said insulating layer comprises a dry etching process.

13. The method of detecting defects of a semiconductor device of claim 12, wherein said dry etching process includes a reactive ion etching process.

14. The method of detecting defects of a semiconductor device of claim 8, wherein said detecting step comprises using a scanning electron microscope to detect said defect.

* * * * *